US012682960B2

(12) United States Patent
    Kataoka

(10) Patent No.: US 12,682,960 B2
(45) Date of Patent: Jul. 14, 2026

(54) SEMICONDUCTOR MEMORY DEVICE APPLYING VOLTAGE TO A BACK GATE OF A TRANSISTOR COUPLED TO A WORD LINE

(71) Applicant: Kioxia Corporation, Tokyo (JP)

(72) Inventor: Hideyuki Kataoka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 106 days.

(21) Appl. No.: 18/621,114

(22) Filed: Mar. 29, 2024

(65) Prior Publication Data

US 2024/0242769 A1     Jul. 18, 2024

Related U.S. Application Data

(63) Continuation of application No. PCT/JP2021/045126, filed on Dec. 8, 2021.

(30) Foreign Application Priority Data

Oct. 1, 2021     (JP) ................................. 2021-162635

(51) Int. Cl.

| | |
|---|---|
| *G11C 16/26* | (2006.01) |
| *G11C 11/56* | (2006.01) |
| *G11C 16/04* | (2006.01) |
| *G11C 16/08* | (2006.01) |
| *G11C 16/10* | (2006.01) |
| *H10B 43/27* | (2023.01) |
| *H10D 30/01* | (2025.01) |

(52) U.S. Cl.
CPC .............. *G11C 16/26* (2013.01); *G11C 11/56* (2013.01); *G11C 16/04* (2013.01); *G11C 16/0483* (2013.01); *G11C 16/08* (2013.01); *G11C 16/10* (2013.01); *H10B 43/27* (2023.02); *H10D 30/021* (2025.01)

(58) Field of Classification Search
CPC ..... G11C 16/26; G11C 16/0483; G11C 16/08; G11C 11/56; G11C 16/04; G11C 16/10; H10D 30/021; H10B 43/27
See application file for complete search history.

(56) References Cited

U.S. PATENT DOCUMENTS

| | | | | |
|---|---|---|---|---|
| 5,880,995 | A | * | 3/1999 | Kobatake ............... G11C 16/08 365/185.11 |
| 9,342,410 | B2 | | 5/2016 | Oshinsky et al. |

(Continued)

FOREIGN PATENT DOCUMENTS

| | | |
|---|---|---|
| JP | 2006331501 A | 12/2006 |
| JP | 2008310900 A | 12/2008 |

OTHER PUBLICATIONS

International Search Report (ISR) (and English language translation thereof) and Written Opinion dated Jan. 18, 2022, issued in International Application No. PCT/JP2021/045126.

*Primary Examiner* — Alexander Sofocleous
*Assistant Examiner* — Joseph Fidelis Stormes
(74) *Attorney, Agent, or Firm* — Holtz, Holtz & Volek PC

(57)     ABSTRACT

According to one embodiment, a semiconductor memory device includes a first memory cell; a word line coupled to a gate of the first memory cell; a first transistor having a first end coupled to the word line; and a control circuit configured to, in a read operation, apply a first voltage, which is positive, to a back gate of the first transistor.

9 Claims, 11 Drawing Sheets

(56)  References Cited

U.S. PATENT DOCUMENTS

| | | | |
|---|---|---|---|
| 9,696,918 | B2 | 7/2017 | Zaltsman et al. |
| 9,946,496 | B2 | 4/2018 | Lotem et al. |
| 2006/0268653 | A1* | 11/2006 | Umezawa .............. H10B 41/49 |
| | | | 257/E21.691 |

* cited by examiner

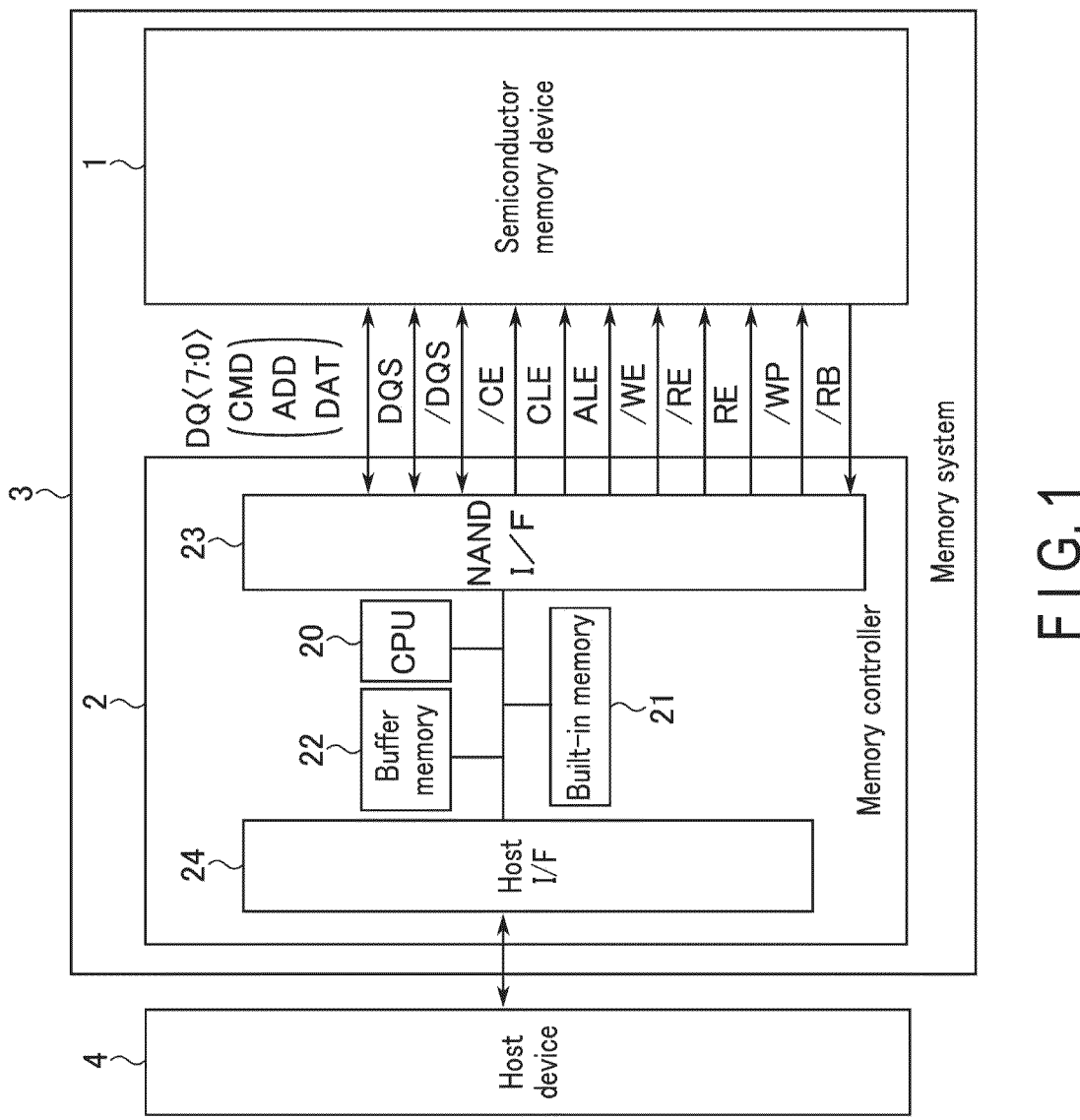
F I G. 1

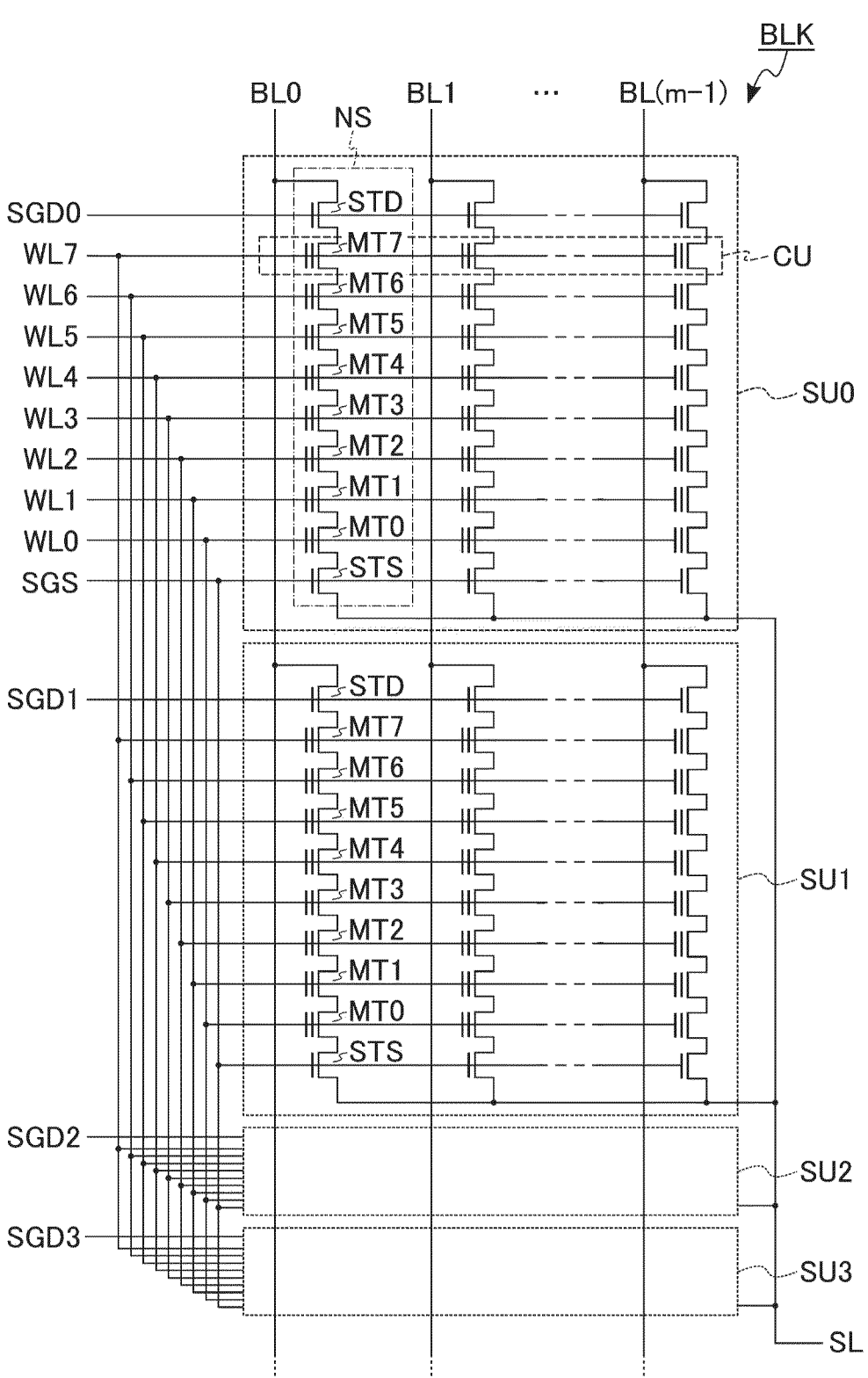
F I G. 3

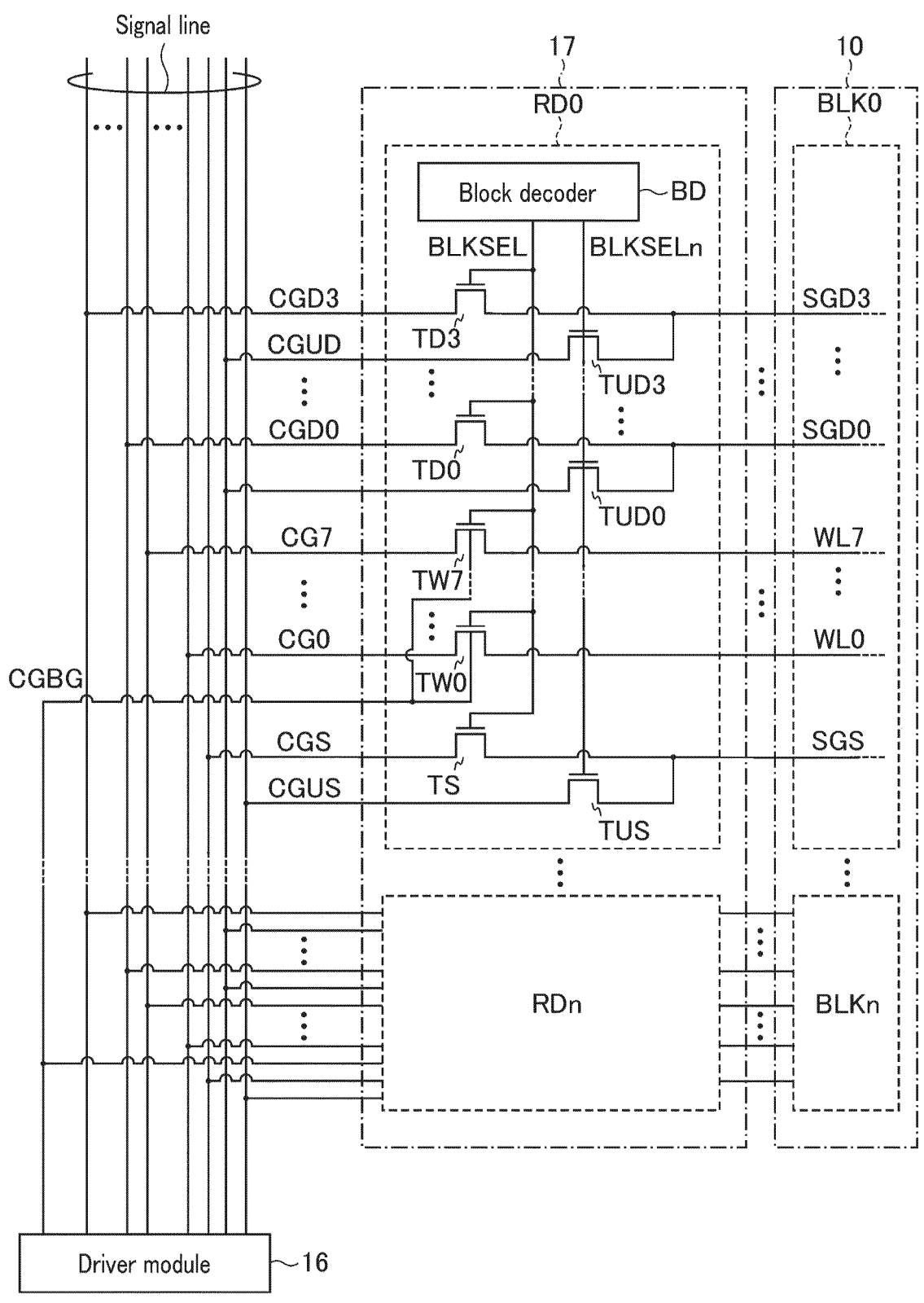
F I G. 5

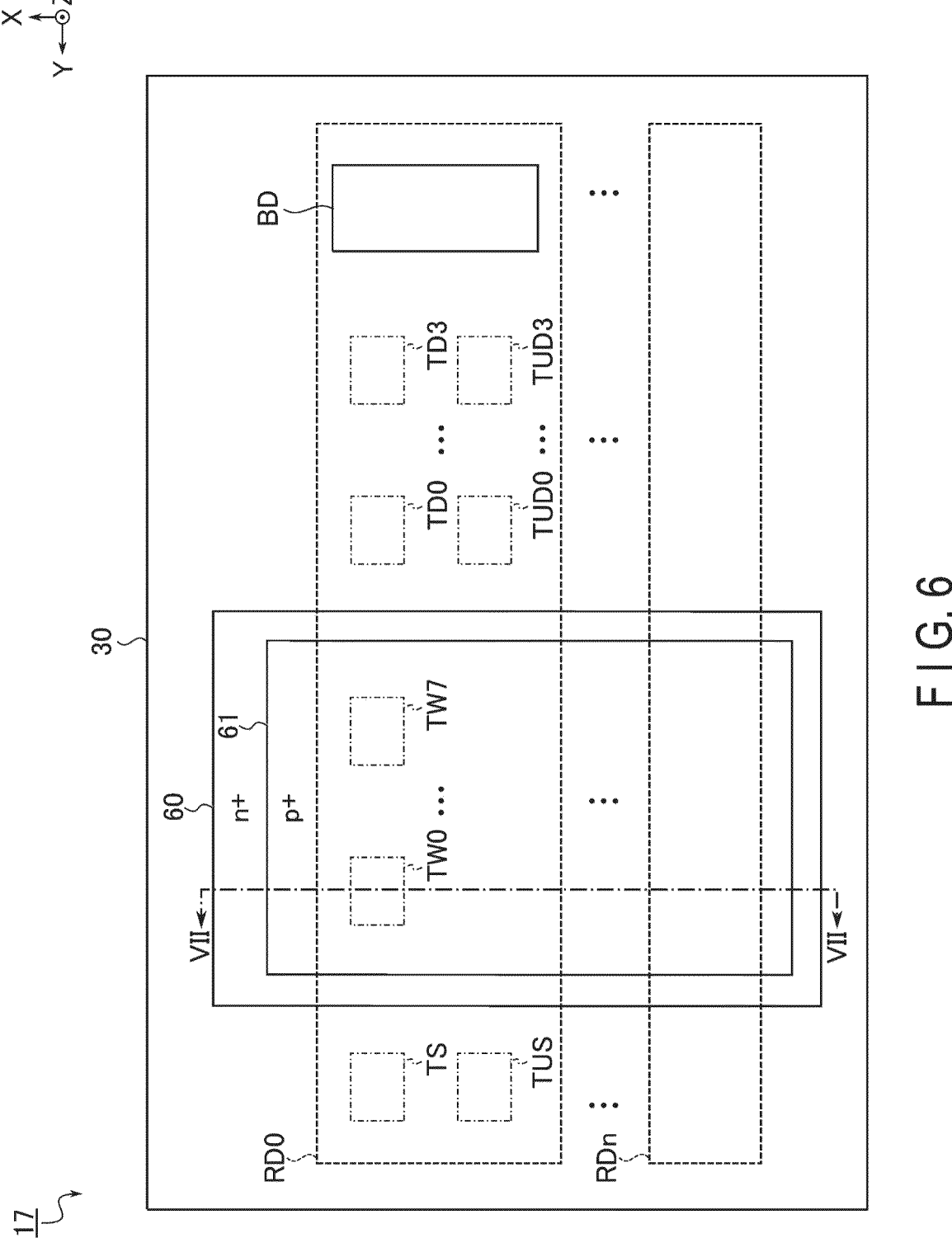
F I G . 6

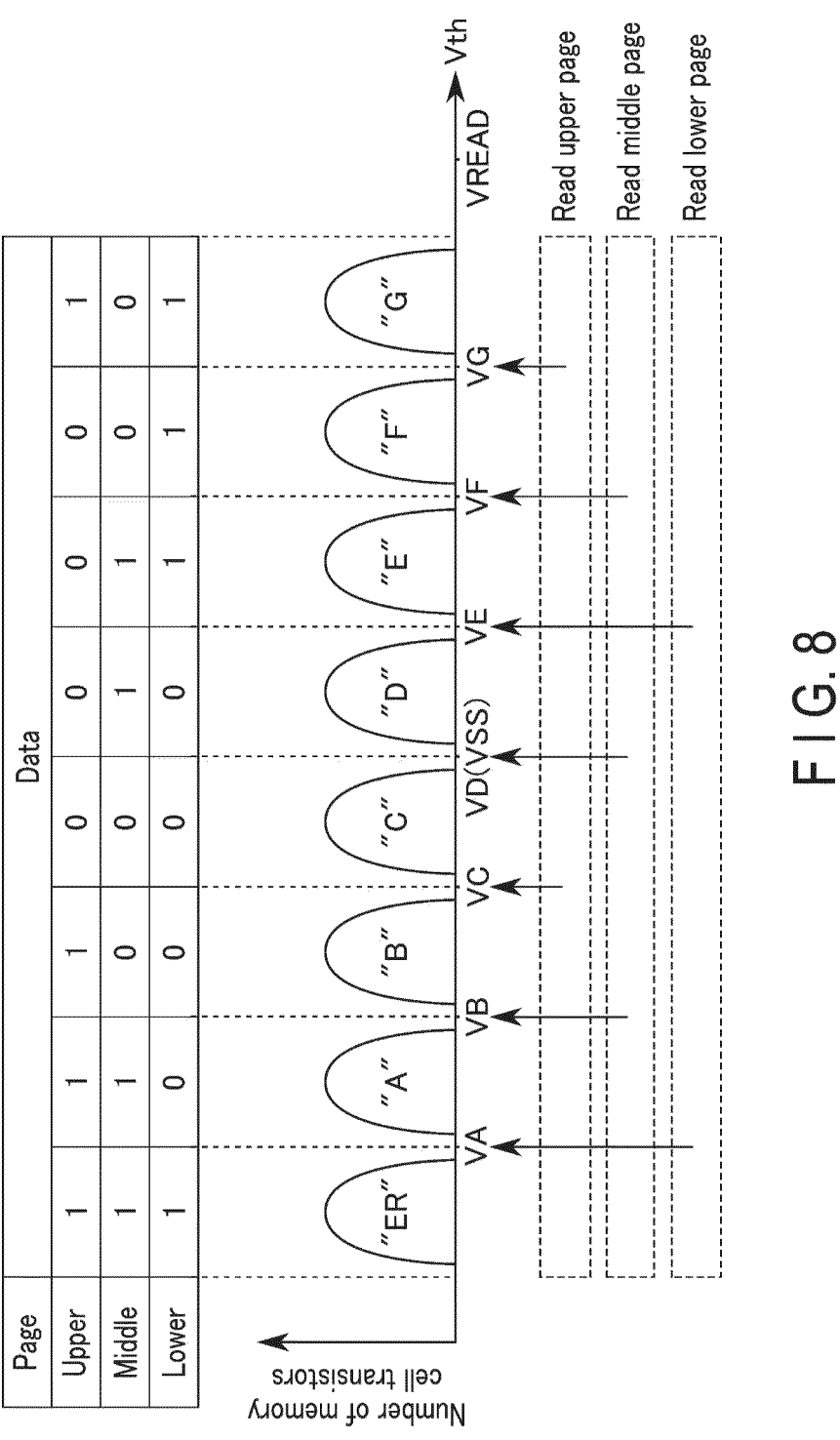
F I G. 8

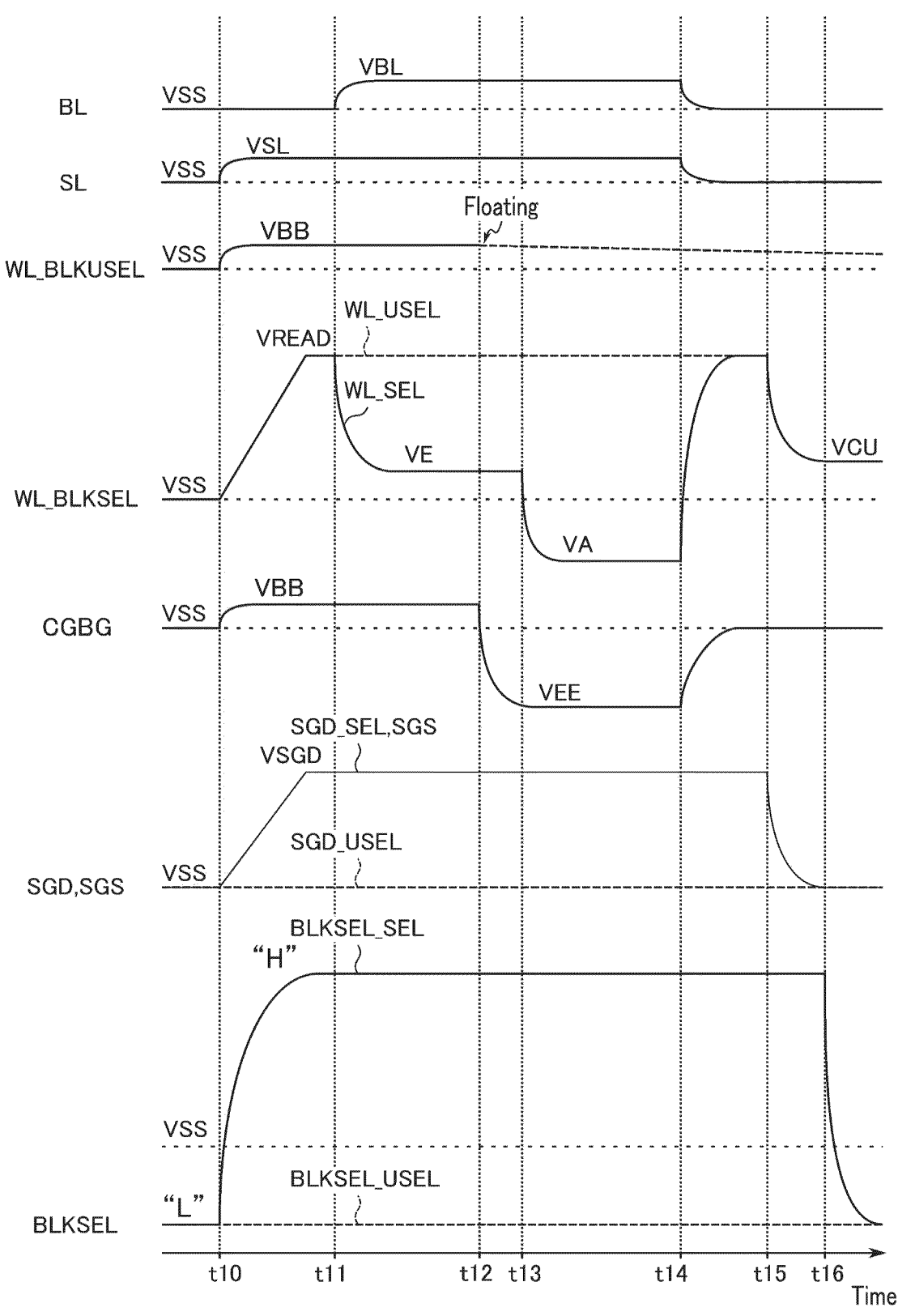
F I G. 9

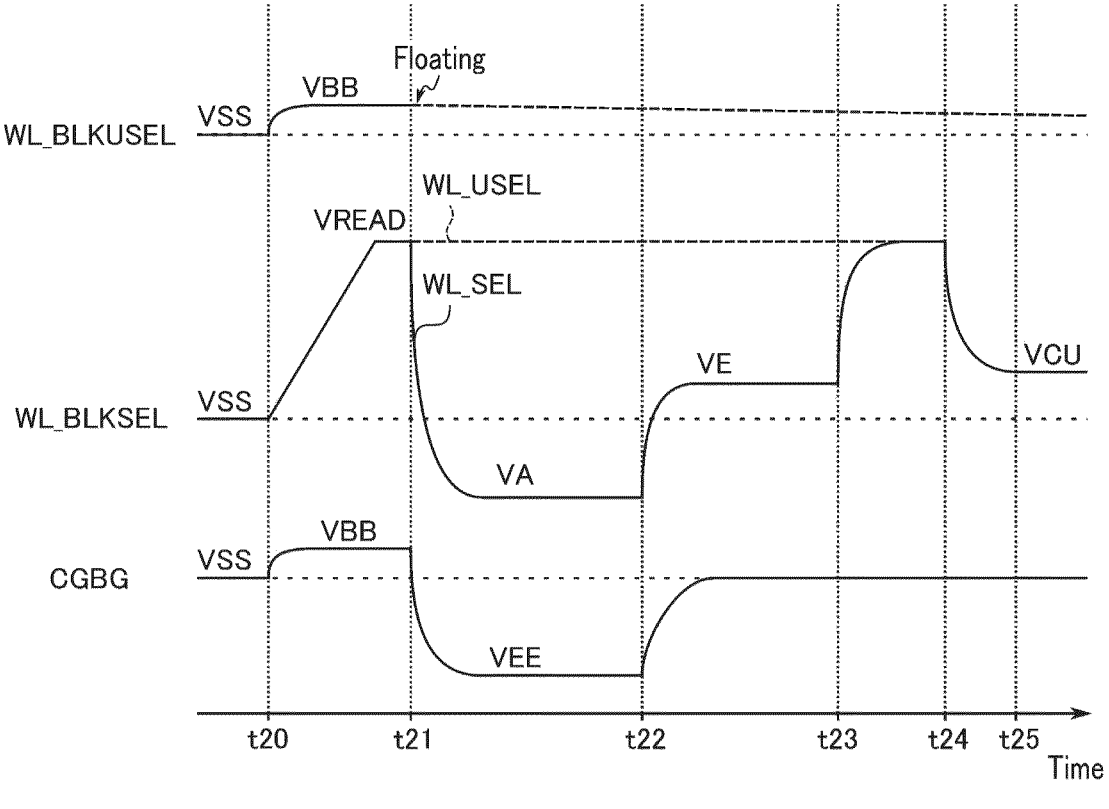
F I G. 10

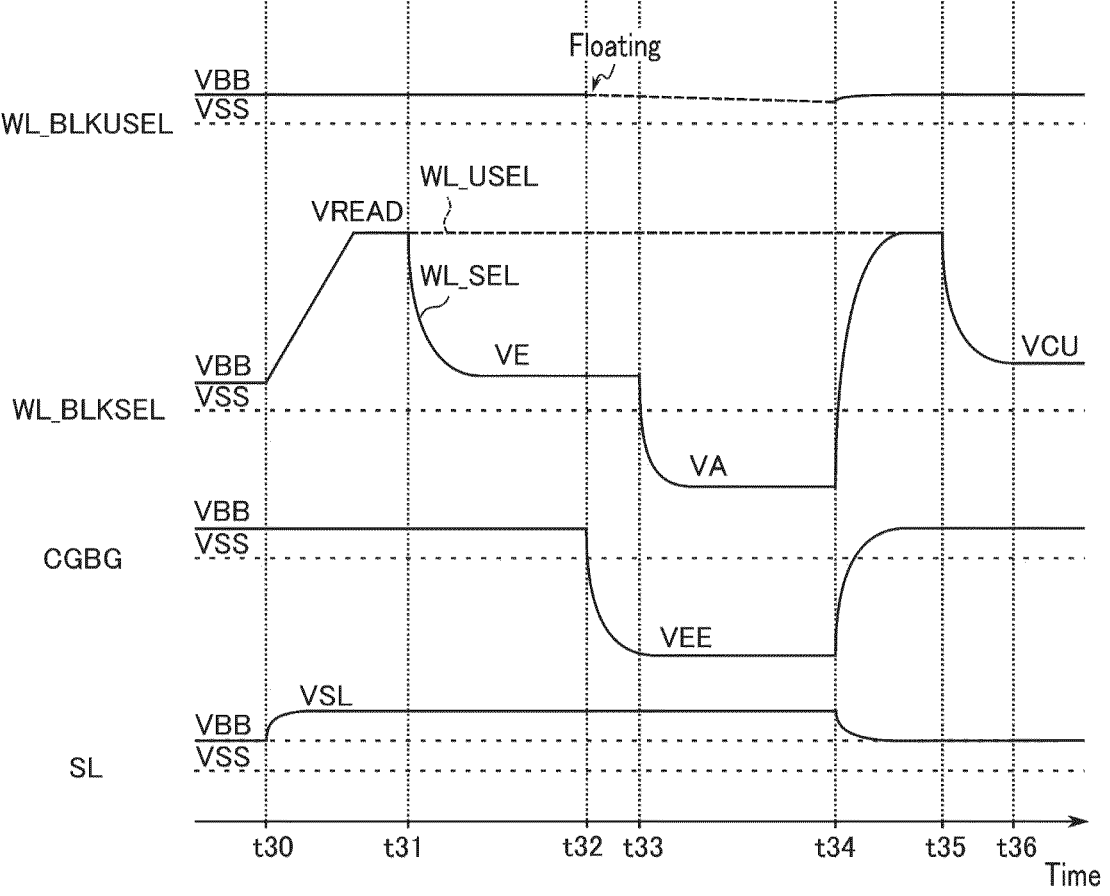
F I G. 11

SEMICONDUCTOR MEMORY DEVICE APPLYING VOLTAGE TO A BACK GATE OF A TRANSISTOR COUPLED TO A WORD LINE

CROSS-REFERENCE TO RELATED APPLICATION(S)

This application is a Continuation Application of PCT Application No. PCT/JP2021/045126, filed Dec. 8, 2021, and based upon and claiming the benefit of priority from Japanese Patent Application No. 2021-162635, filed Oct. 1, 2021, the entire contents of all of which are incorporated herein by reference.

FIELD

Embodiments described herein relate generally to a semiconductor memory device.

BACKGROUND

NAND-type flash memories are known as semiconductor memory devices.

BRIEF DESCRIPTION OF THE DRAWINGS

FIG. 1 is a block diagram showing an example of a configuration of a memory system including a semiconductor memory device according to an embodiment and a host device.

FIG. 3 is a circuit diagram for explaining a configuration of a memory cell array of the semiconductor memory device according to the embodiment.

FIG. 5 is a circuit diagram for explaining an example of configurations of a row decoder module, a driver module, and the memory cell array of the semiconductor memory device according to the embodiment.

FIG. 6 is an example of a planar layout of the row decoder module of the semiconductor memory device according to the embodiment.

FIG. 8 is a diagram for explaining a threshold voltage distribution of memory cell transistors included in the semiconductor memory device according to the embodiment.

FIG. 9 is a timing chart showing voltages of respective interconnects at the time of a read operation using the semiconductor memory device according to the embodiment.

FIG. 10 is a timing chart showing voltages of respective interconnects at the time of a read operation using the semiconductor memory device according to the embodiment.

FIG. 11 is a timing chart showing voltages of respective interconnects at the time of a read operation using the semiconductor memory device according to a modification.

DETAILED DESCRIPTION

Figure 2:
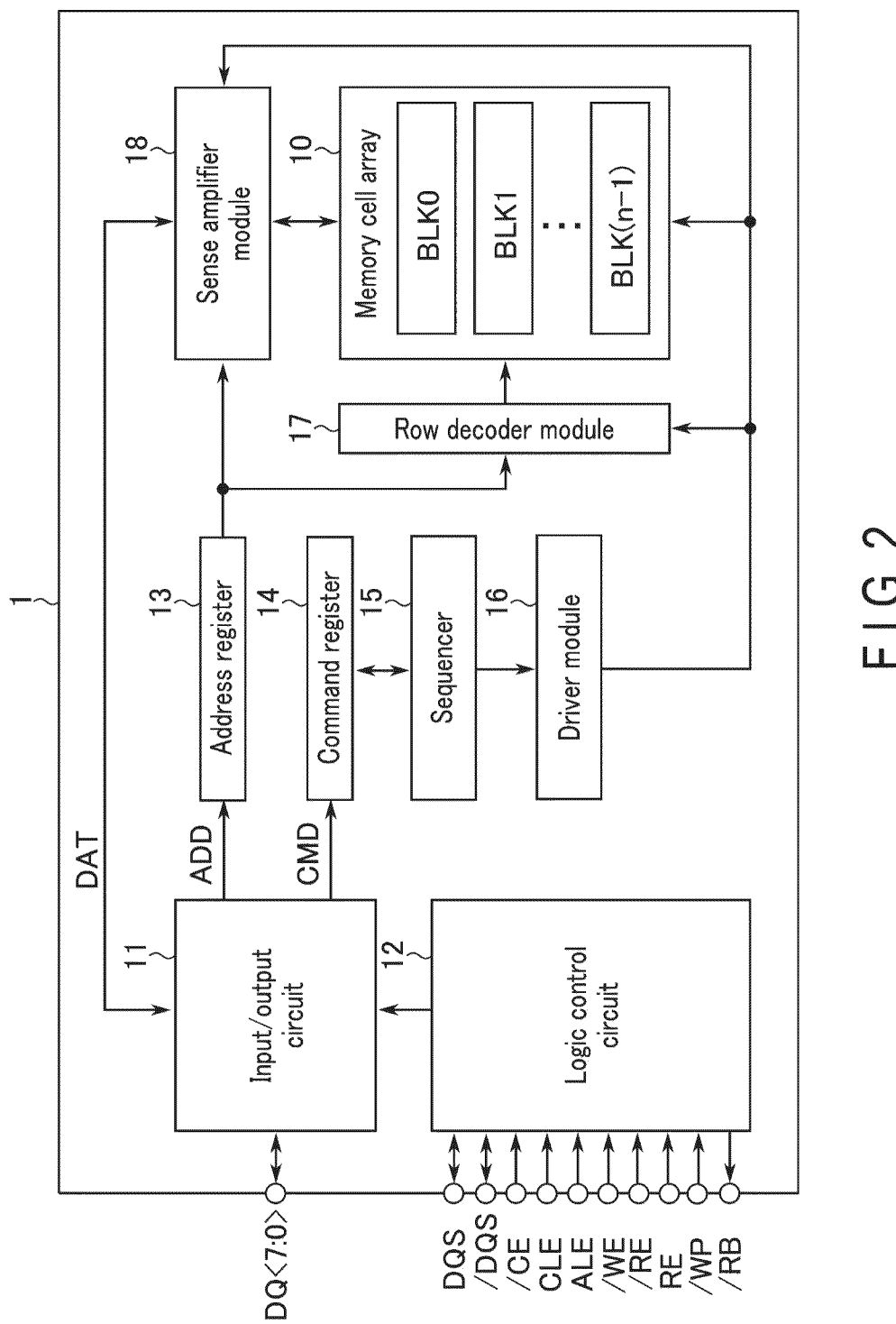
FIG. 2 is a block diagram showing an example of a configuration of the semiconductor memory device according to the embodiment.

According to one embodiment, a semiconductor memory device includes a first memory cell; a word line coupled to a gate of the first memory cell; a first transistor having a first end coupled to the word line; and a control circuit configured to, in a read operation, apply a first voltage, which is positive, to a back gate of the first transistor.

Hereinafter, embodiments will be described with reference to the accompanying drawings. In the following explanation, components having the same functions and configurations will be referred to by the same reference symbols.

The description will use the same reference symbols for the structural elements having substantially the same functions and configurations. For the purpose of distinguishing between elements having the same or substantially the same configurations, the description may add different characters or numerals after their respective reference signs.

1. Embodiment

1.1 Configuration

1.1.1 Memory System

First, a configuration example of a memory system will be described with reference to FIG. 1. FIG. 1 is a block diagram showing an example of a configuration of a memory system including a semiconductor memory device according to an embodiment and a host device.

A host device 4 is, for example, a digital camera, a personal computer, a server in a data center, or the like. The host device 4 stores address information for identifying data stored in the memory system 3. The host device 4 is configured to be able to instruct writing and reading of data in the memory system 3 based on the address information.

The memory system 3 is, for example, a solid state drive (SSD), an SD™ card, or the like. The memory system 3 communicates with an external host device 4, for example. The memory system 3 stores data supplied from the host device 4. The memory system 3 reads data into the host device 4.

The memory system 3 includes a semiconductor memory device 1 and a memory controller 2.

The semiconductor memory device 1 includes a plurality of memory cell transistors and stores data in a non-volatile manner. The semiconductor memory device 1 is coupled to the memory controller 2 via a NAND bus.

The NAND bus transmits and receives signals DQ<7:0>, DQS, /DQS, /CE, CLE, ALE, /WE, /RE, RE, /WP, and /RB that comply with a NAND interface via individual signal lines. The signal DQS is a data strobe signal. The signal DQS is used to control the operation timing of the semiconductor memory device 1 related to the signal DQ<7:0>. The signal /DQS is a complementary signal of the signal DQS. The signal /CE is a chip enable signal. The signal /CE is a signal to enable the semiconductor memory device 1. The signal CLE is a command latch enable signal. The signal CLE notifies the semiconductor memory device 1 that the signal DQ<7:0> which is sent to the semiconductor memory device 1 while the signal CLE is at the "H (high)" level is a command. The signal ALE is an address latch enable signal. The signal ALE notifies the semiconductor memory device 1 that the signal DQ<7:0> which is sent to the semiconductor memory device 1 while the signal ALE is at the "H" level is an address. The signal /WE is a write enable signal. The signal /WE instructs the semiconductor memory device 1 to fetch the signal DQ<7:0>. The signal /RE is a read enable signal. The signal /RE is an instruction for the semiconductor memory device 1 to output the signal DQ<7: 0>. The signal RE is a complementary signal to the signal /RE. The signal /WP is a write protect signal. The signal /WP instructs the semiconductor memory device 1 to prohibit data writing and data erasing. The signal /RB is a ready busy signal. The signal /RB is an indication that the semiconductor memory device 1 is in a ready state (the state of accepting an external command) or a busy state (the state of not accepting an external command).

The signal DQ<7:0> is, for example, a signal of 8 bits. The signal DQ<7:0> is transmitted and received between the semiconductor memory device 1 and the memory controller 2. The signal DQ<7:0> includes an address ADD, a command CMD, and data DAT. The command CMD is a signal for controlling the entire semiconductor memory device 1. The data DAT includes read data and write data.

The memory controller 2 receives a command from the host device 4. The memory controller 2 controls the semiconductor memory device 1 based on the received command. Specifically, the memory controller 2 writes data instructed to be written in the semiconductor memory device 1 based on the write command received from the host device 4. In addition, the memory controller 2 reads data, which is instructed to be read by the host device 4, from the semiconductor memory device 1 based on a read command received from the host device 4, and transmits the read data to the host device 4.

1.1.2 Memory Controller

As shown in FIG. 1, the memory controller 2 includes a central processing unit (CPU) 20, a built-in memory 21, a buffer memory 22, a NAND interface circuit (NAND I/F) 23, and a host interface circuit (host I/F) 24. The memory controller 2 is configured as, for example, a system-on-a-chip (SoC).

The CPU 20 controls the operation of the entire memory controller 2. The CPU 20 issues commands for instructing the semiconductor memory device 1 to perform various operations such as a write operation, a read operation, and an erase operation.

The built-in memory 21 is, for example, a semiconductor memory such as a dynamic random access memory (DRAM), provided for use by the CPU 20 as a workspace. The built-in memory 21 stores firmware, various management tables, and the like, for managing the semiconductor memory device 1.

The buffer memory 22 temporarily stores write data received from the host device 4, read data received by the memory controller 2 from the semiconductor memory device 1, and the like.

The NAND interface circuit 23 is coupled to the semiconductor memory device 1 via a NAND bus. The NAND interface circuit 23 conducts communications with the semiconductor memory device 1. The NAND interface circuit 23 transmits the command CMD, the address ADD, and the write data to the semiconductor memory device 1, in accordance with instructions from the CPU 20. The NAND interface circuit 23 receives read data from the semiconductor memory device 1.

The host interface circuit 24 is coupled to the host device 4 via a host bus. The host interface circuit 24 controls communications between the memory controller 2 and the host device 4. The host interface circuit 24 transfers, for example, commands and data received from the host device 4 to the CPU 20 and the buffer memory 22, respectively.

1.1.3 Semiconductor Memory Device

Next, a configuration example of the semiconductor memory device 1 according to the embodiment will be described with reference to FIG. 2. FIG. 2 is a block diagram showing an example of the configuration of the semiconductor memory device 1 according to the embodiment.

The semiconductor memory device 1 includes a memory cell array 10, an input/output circuit 11, a logic control circuit 12, an address register 13, a command register 14, a sequencer 15, a driver module 16, a row decoder module 17, and a sense amplifier module 18.

The memory cell array 10 includes n blocks BLK0 through BLK(n−1) ("n" is an integer equal to or greater than 1). Each block BLK is a group of a plurality of memory cell transistors configured to store data in a non-volatile manner, and is used as, for example, a data erasure unit. That is, data stored in the memory cell transistors included in the same block BLK is collectively erased. A detailed configuration of the memory cell array 10 will be described later.

The input/output circuit 11 transmits and receives signals DQ<7:0> to and from the memory controller 2. The input/output circuit 11 transfers the address ADD and the command CMD included in the signal DQ<7:0> to the address register 13 and the command register 14, respectively. The input/output circuit 11 transmits and receives data DAT to and from the sense amplifier module 18.

The logic control circuit 12 receives, for example, signals DQS, /DQS, /CE, CLE, ALE, /WE, /RE, RE, and /WP from the memory controller 2, and controls the input/output circuit 11 based on the received signals. The logic control circuit 12 generates and transmits a signal /RB to the memory controller 2.

The address register 13 stores the address ADD transferred from the input/output circuit 11. The address register 13 transfers the stored address ADD to the row decoder module 17 and the sense amplifier module 18.

The command register 14 stores the command CMD transferred from the input/output circuit 11. The command register 14 transfers the stored command CMD to the sequencer 15.

The sequencer 15 receives the command CMD from the command register 14. The sequencer 15 controls the entire semiconductor memory device 1 according to a sequence based on the received command CMD. For example, in a case where the sequencer 15 receives an erase command, a write command, or a read command, the sequencer 15 instructs the driver module 16 to generate a voltage for use in the corresponding operation.

The driver module 16 generates a voltage for use in an erase operation, a write operation, a read operation, and the like based on an instruction from the sequencer 15. The driver module 16 supplies the generated voltage to the memory cell array 10, the row decoder module 17, the sense amplifier module 18, and the like.

The row decoder module 17 receives a block address in the address ADD from the address register 13. The row decoder module 17 selects any one of the blocks BLK0 through BLK(n−1) based on the block address. The row decoder module 17 applies the voltage supplied from the driver module 16 to, for example, the selected block BLK.

The sense amplifier module 18 receives a column address in the address ADD from the address register 13. The sense amplifier module 18 transfers data DAT between the memory controller 2 and the memory cell array 10 based on the column address. More specifically, the sense amplifier module 18 receives write data from the input/output circuit 11 in a write operation. The sense amplifier module 18 transfers the received write data to the memory cell array 10. In addition, the sense amplifier module 18 senses a threshold voltage of a memory cell transistor which is a target of the read operation in the memory cell array 10 and generates read data in a read operation. The sense amplifier module 18 transfers the generated read data to the input/output circuit 11.

1.1.4 Memory Cell Array

Circuit Configuration

A circuit configuration of the memory cell array 10 of the semiconductor memory device 1 according to the embodiment will be described with reference to FIG. 3. FIG. 3 is a circuit diagram for explaining a configuration of the memory cell array 10 in the semiconductor memory device 1 according to the embodiment.

The block BLK includes, for example, four string units SUs (SU0, SU1, SU2, and SU3). Each string unit SU includes a plurality of NAND strings NS.

Each of the NAND strings NS includes, for example, 8 memory cell transistors MT (MT0 through MT7) and select transistors STD and STS. Note that the number of the memory cell transistors MT in each NAND string NS is not limited to 8 but may be discretionarily determined to be, for example, 16, 32, 48, 64, 96, 128, etc. That is, the number of word lines WL included in the block BLK is not limited to 8, but may be discretionarily determined to be 16, 32, 48, 64, 96, 128, etc. The memory cell transistor MT includes a stacked gate including a control gate and a charge storage layer. The memory cell transistors MT are coupled in series between the select transistors STD and STS.

In one block BLK, the gates of the select transistors STD of the string units SU0 through SU3 are coupled to select gate lines SGD (SGD0 through SGD3), respectively. In addition, the gates of the select transistors STS of the string units SU in the block BLK are coupled in common to a select gate line SGS. In the select gate line SGS, the gates of the select transistors STS of the string units SU0 through SU3 may be coupled to the select gate lines SGS0 through SGS3 (not shown), respectively, similarly to the select gate line SGD. The control gates of the memory cell transistors MT0 through MT7 in the same block BLK are respectively coupled to word lines WL0 through WL7. That is, the word line WL and the select gate line SGS are coupled in common to the string units SU0 through SU3 in the same block BLK. On the other hand, the select gate line SGD is coupled to one of the string units SU in the same block BLK.

Of the NAND strings NS arranged in a matrix pattern in the memory cell array 10, a second end of the select transistor STD of the NAND strings NS of the same row is coupled to any one of m bit lines BL (BL0 through BL(m−1), where m is a natural number equal to or greater than 2). The bit line BL is coupled in common to the NAND strings NS of the same column in the n blocks BLK.

A second end of the select transistor STS is coupled to the source line SL. The source line SL is commonly coupled to the plurality of NAND strings NS over the n blocks BLK.

As described above, the erase operation is performed collectively on the memory cell transistors MT in the same block BLK, for example. On the other hand, the write operation and the read operation can be collectively performed on the memory cell transistors MT which are coupled in common to a given word line WL in a given string unit SU of a given block BLK. A set of memory cell transistors MT sharing a word line WL in one string unit SU is referred to as, for example, a cell unit CU. In other words, the cell unit CU is a set of memory cell transistors MT to which the write operation or read operation can be performed collectively.

A unit of a data string, constituted by 1-bit data stored in each of the memory cell transistors MT within the cell unit CU, is defined as "page". One memory cell transistor MT can store, for example, 3-bit data. Bits constituting this 3-bit data are referred to as a lower bit, a middle bit, and an upper bit, respectively. In this case, data of three pages is stored in the cell unit CU, and a set of lower bits stored in each memory cell transistor MT in the cell unit CU is referred to as a lower page, a set of middle bits is referred to as a middle page, and a set of upper bits is referred to as an upper page. The memory cell transistor MT may be configured to store not only data of 3 bits but may store data of 2 bits or 4 bits or more.

Structure

Figure 4:
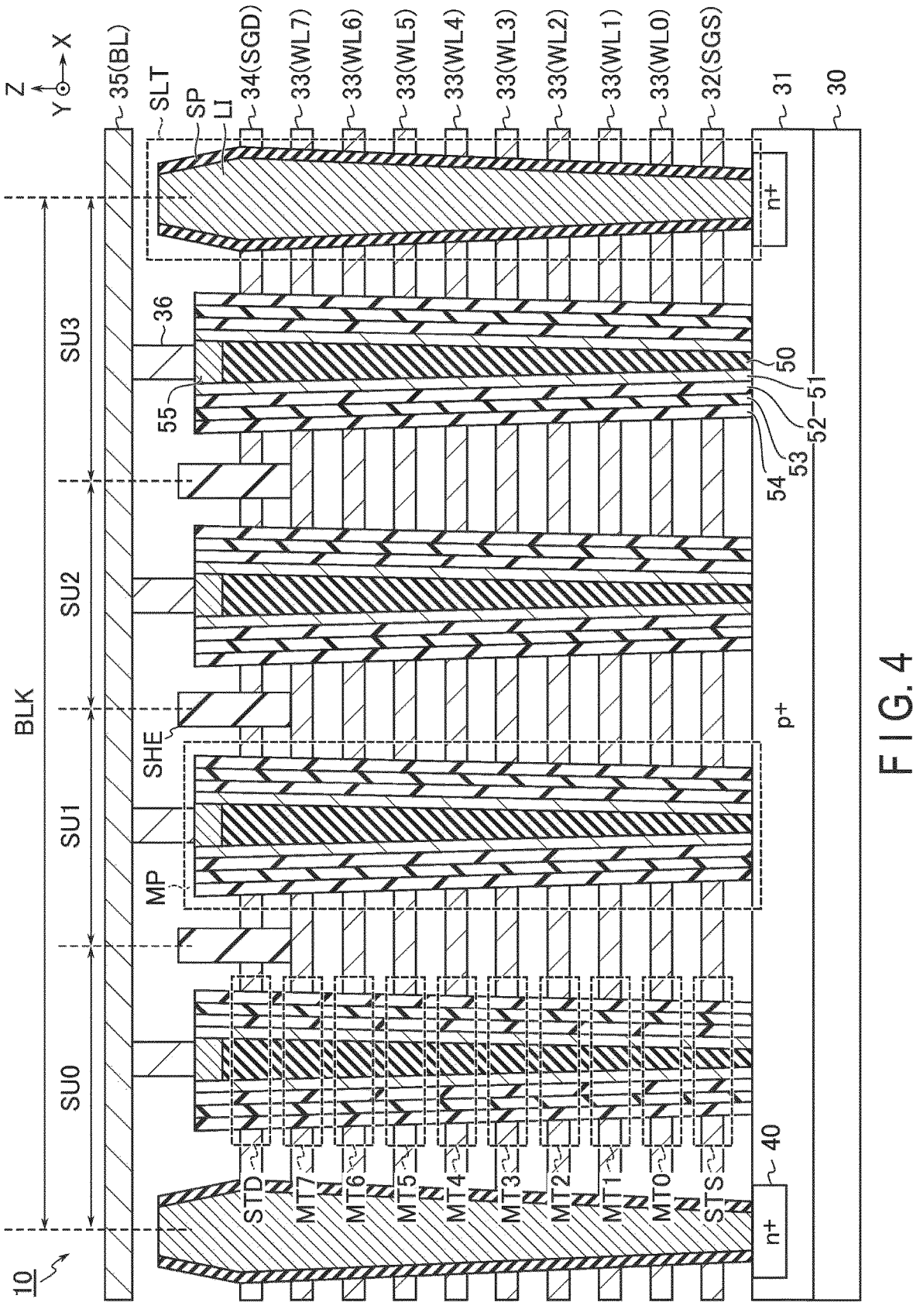
FIG. 4 is a cross-sectional view for explaining an example of a cross-sectional structure of the memory cell array of the semiconductor memory device according to the embodiment.

Next, the structure of the memory cell array 10 will be described with reference to FIG. 4. FIG. 4 is a cross-sectional view for explaining an example of a cross-sectional structure of the memory cell array of the semiconductor memory device according to the embodiment. FIG. 4 shows the structure of the memory cell array 10 in a region corresponding to one block BLK.

In FIG. 4, the X direction is a direction in which the bit line BL extends, the Y direction is a direction in which the word line WL extends, and the Z direction is a direction perpendicular to the upper surface of the semiconductor substrate on which the semiconductor memory device 1 is formed.

The memory cell array 10 includes a semiconductor substrate 30, conductive layers 32 through 36, a plurality of memory pillars MP, and a plurality of members SHE and SLT.

The semiconductor substrate 30 includes a P-type well region 31 provided in the vicinity of the upper surface of the semiconductor substrate 30. The P-type well region 31 is a region containing a P-type impurity (for example, boron). The P-type well region 31 is used as the source line SL.

The P-type well region 31 includes an N-type semiconductor region 40 provided in the vicinity of the upper surface of the P-type well region 31. The N-type semiconductor region 40 is a region containing an N-type impurity (for example, phosphorus).

A conductive layer 32 is formed above the P-type well region 31 with an insulating layer (not shown) interposed therebetween. The conductive layer 32 is, for example, formed in a plate shape spreading along the XY plane. The conductive layer 32 is used as a select gate line SGS. The conductive layer 32 contains, for example, tungsten.

Insulating layers (not shown) and the conductive layers 33 are alternately stacked above the conductive layer 32. The conductive layer 33 is, for example, formed in a plate shape spreading along the XY plane. The conductive layers 33 are used as word lines WL0 through WL7, respectively, sequentially from the side of the semiconductor substrate 30. The conductive layer 33 contains, for example, tungsten.

A conductive layer 34 is formed above the uppermost conductive layer 33 with an insulating layer (not shown) interposed therebetween. The conductive layer 34 is, for example, formed in a plate shape spreading along the XY plane. The conductive layer 34 is used as a select gate line SGD. The conductive layer 34 contains, for example, tungsten.

A conductive layer 35 is provided above the conductive layer 34 with an insulating layer (not shown) interposed therebetween. The conductive layer 35 is formed, for example, in a line shape extending in the X direction. The conductive layer 35 is used as a bit line BL. That is, in a region not shown in the drawings, the conductive layers 35 are arranged along the Y direction. The conductive layer 35 contains, for example, copper.

Each of the members SLT extends in the Z direction and splits the conductive layers 32 through 34. A region partitioned by two adjacent members SLT corresponds to one block BLK.

Each of the members SLT includes a contact LI and a spacer SP.

The upper end of the contact LI is in a layer between the conductive layers 34 and 35. The lower end of the contact LI is in contact with the N-type semiconductor region 40. The contact LI is a conductor. The contact LI is used as the source line SL.

The spacer SP covers the side surface of the contact LI. The spacer SP is an insulator.

With such a configuration of the member SLT, the contact LI and the conductive layers 32 through 34 are electrically insulated from each other by the spacer SP.

Each of the memory pillars MP is provided to extend in the Z-direction below the conductive layer 35 between two adjacent members SLT and penetrates the conductive layers 32 through 34. The bottom of each of the memory pillars MP is in contact with the P-type well region 31.

Each of the memory pillars MP includes, for example, a core member 50, a semiconductor film 51, a tunnel insulating film 52, a charge accumulating film 53, a block insulating film 54, and a semiconductor portion 55.

The core member 50 extends, for example, in the Z direction. The upper end of the core member 50 is located above the conductive layer 34. The lower end of the core member 50 is in contact with the P-type well region 31. The core member 50 contains, for example, silicon oxide.

The semiconductor film 51 covers the side surface of the core member 50. The upper end of the semiconductor film 51 is located above the upper end of the core member 50. The semiconductor film 51 contains, for example, polysilicon.

The tunnel insulating film 52 covers the side surface of the semiconductor film 51. The tunnel insulating film 52 contains silicon oxide.

The charge accumulating film 53 covers the side surface of the tunnel insulating film 52. The charge accumulating film 53 contains, for example, an insulator (for example, silicon nitride) having a trap level.

The block insulating film 54 covers the side surface of the charge accumulating film 53. The block insulating film 54 contains, for example, silicon oxide.

The semiconductor portion 55 is arranged to cover the upper end of the core member 50. The side surface of the semiconductor portion 55 is covered by a portion of the semiconductor film 51 that is located above the upper end of the core member 50.

The conductive layer 36 is provided on the upper surface of the semiconductor portion 55. The conductive layer 35 is in contact with the upper surface of the conductive layer 36.

In the structure of the memory pillar MP described above, a portion where the memory pillar MP and the conductive layer 32 intersect functions as the select transistor STS. A portion where the memory pillar MP and the conductive layer 33 intersect functions as the memory cell transistor MT. A portion where the memory pillar MP and the conductive layer 34 intersect functions as the select transistor STD. The semiconductor film 51 functions as a channel of each of the memory cell transistors MT0 through MT7 and the select transistors STS and STD. The charge accumulating film 53 functions as a charge storage layer of the memory cell transistor MT.

The member SHE is provided so as to split the conductive layer 34. The upper end of the member SHE is located in a layer between the conductive layers 34 and 35. The lower end of the member SHE is located in a layer between the conductive layers 33 and 34. The member SHE is an insulator.

In the structure of the memory cell array 10 as described above, each of the regions sectioned by the members SLT and SHE corresponds to one string unit SU. In the memory cell array 10, for example, the structure of the block BLK shown in FIG. 4 is repeatedly arranged in the X direction.

1.1.5 Row Decoder Module

Circuit Configuration

Next, the configuration of the row decoder module 17 will be described with reference to FIG. 5. FIG. 5 is a circuit diagram for explaining an example of configurations of the row decoder module, the driver module, and the memory cell array of the semiconductor memory device according to the embodiment.

The row decoder module 17 includes row decoders RD0 through RDn. The row decoders RD0 through RDn are used to select a block BLK. The row decoders RD0 through RDn are respectively associated with block BLK0 through BLK (n–1).

Each row decoder RD includes, for example, a block decoder BD and transistors TS, TUS, TW (TW0 through TW7), TD (TD0 through TD3), and TUD (TUD0 through TUD3). The transistors TS, TUS, TW, TD, and TUD are, for example, high-withstand-voltage N-channel metal-oxide-semiconductor field effect transistors (MOSFETs). The transistors TW0 through TW7 are respectively associated with the word lines WL0 through WL7 included in the corresponding blocks BLK. The transistors TS and TD0 through TD3 and the transistors TUS and TUD0 through TUD3 are respectively associated with the select gate lines SGS and SGD0 through SGD3 included in the corresponding blocks BLK.

The block decoder BD decodes a block address in the address ADD. The block decoder BD applies a voltage of an "H (High)" level and a voltage of an "L (Low)" level to transfer gate lines BLKSEL and BLKSELn, respectively, based on, for example, the decoding result. The block decoder BD applies a voltage of the "L" level to the transfer gate line BLKSELn while applying a voltage of the "H" level to the transfer gate line BLKSEL. In addition, the block decoder BD applies a voltage of the "H" level to the transfer gate line BLKSELn while applying a voltage of "L" level to the transfer gate line BLKSEL.

The transistors TS, TUS, TW, TD, and TUD couple the driver module 16 and the corresponding block BLK via the signal lines CG (CGS, CGUS, CG0 through CG7, CGD0 through CGD3, and CGUD).

More specifically, in each row decoder RD, the gate of the transistor TS is coupled to the transfer gate line BLKSEL. A first end of the transistor TS is coupled to the driver module 16 via the signal line CGS. A second end of the transistor TS is coupled to the select gate line SGS.

The gate of the transistor TUS is coupled to the transfer gate line BLKSELn. A first end of the transistor TUS is coupled to the driver module 16 via the signal line CGUS. A second end of the transistor TUS is coupled to the select gate line SGS together with a second end of the transistor TS.

The gate of each transistor TW is coupled to the transfer gate line BLKSEL. A first end of each transistor TW is coupled to the driver module 16 via a corresponding signal line among the signal lines CG0 through CG7. A second end of each transistor TW is coupled to a corresponding word line WL.

The gate of each transistor TD is coupled to the transfer gate line BLKSEL. A first end of each transistor TD is coupled to the driver module 16 via a corresponding signal line among the signal lines CGD0 through CGD3. A second end of each transistor TD is coupled to a corresponding select gate line SGD.

The gate of each transistor TUD is coupled to the transfer gate line BLKSELn. A first end of each transistor TUD is coupled to the driver module 16 via the signal line CGUD. A second end of each transistor TUD is coupled to a corresponding select gate line SGD together with a corresponding transistor TD.

The back gates of the transistors TW0 through TW7 among the transistors TS, TUS, TW, TD, and TUD are coupled to the driver module 16 via a common back gate line CGBG. That is, the transistors TW0 through TW7 share the back gate. On the other hand, the transistors TS, TUS, TD, and TUD do not share the back gate with the transistors TW0 through TW7.

If a voltage of the "H" level is applied to the transfer gate line BLKSEL, the transistors TS, TW0 through TW7, and TD0 through TD3 are turned on. As a result, the voltages of the signal lines CGS, CG0 through CG7, and CGD0 through CGD3 are transferred to the select gate line SGS, the word lines WL0 through WL7, and the select gate lines SGD0 through SGD3 via the transistors TS, TW0 through TW7, and TD0 through TD3, respectively. If a voltage of the "L" level is applied to the transfer gate line BLKSEL, the transistors TS, TW0 through TW7, and TD0 through TD3 are turned off.

If a voltage of the "H" level is applied to the transfer gate line BLKSELn (if a voltage of the "L" level is applied to the transfer gate line BLKSEL), the transistors TUS and TUD0 through TUD3 are turned on. As a result, the voltage of the signal line CGUS is transferred to the select gate line SGS via the transistor TUS. The voltage of the signal line CGUD is transferred to the select gate lines SGD0 through SGD3 via the transistors TUD0 through TUD3. In a case where a voltage of the "L" level is applied to the transfer gate line BLKSELn (in a case where a voltage of the "H" level is applied to the transfer gate line BLKSEL), the transistors TUS and TUD0 through TUD3 are turned off. The voltage of the signal lines CGUS and CGUD in the read operation is, for example, a ground voltage VSS. That is, in a case where a voltage of the "H" level is applied to the transfer gate line BLKSELn of the row decoder RD, the ground voltage VSS is applied to the select gate lines SGS and SGD0 through SGD3 of the block BLK corresponding to the row decoder RD (the select transistors STS and STD are turned off).

Planar Layout

A planar layout of the row decoder module 17 of the semiconductor memory device 1 according to the embodiment will be described with reference to FIG. 6. FIG. 6 is an example of a planar layout of the row decoder module of the semiconductor memory device according to the embodiment.

The row decoder module 17 is provided on the semiconductor substrate 30.

The row decoder module 17 includes an N-type well region 60. The N-type well region 60 is a region containing an N-type impurity. The N-type well region 60 has, for example, a rectangular shape.

A P-type well region 61 is formed within the N-type well region 60. The P-type well region 61 is a region containing a P-type impurity. The P-type well region 61 has, for example, a rectangular shape.

The row decoders RD0 through RDn each have, for example, a rectangular shape and are arranged in this order along the X direction.

The row decoders RD0 through RDn share the P-type well region 61. More specifically, the transistor TW included in each row decoder RD is provided inside the P-type well region 61.

In each row decoder RD, the transistors TS, TUS, TD, and TUD and the block decoder BD are provided outside the N-type well region 60.

Cross-Sectional Structure

Figure 7:
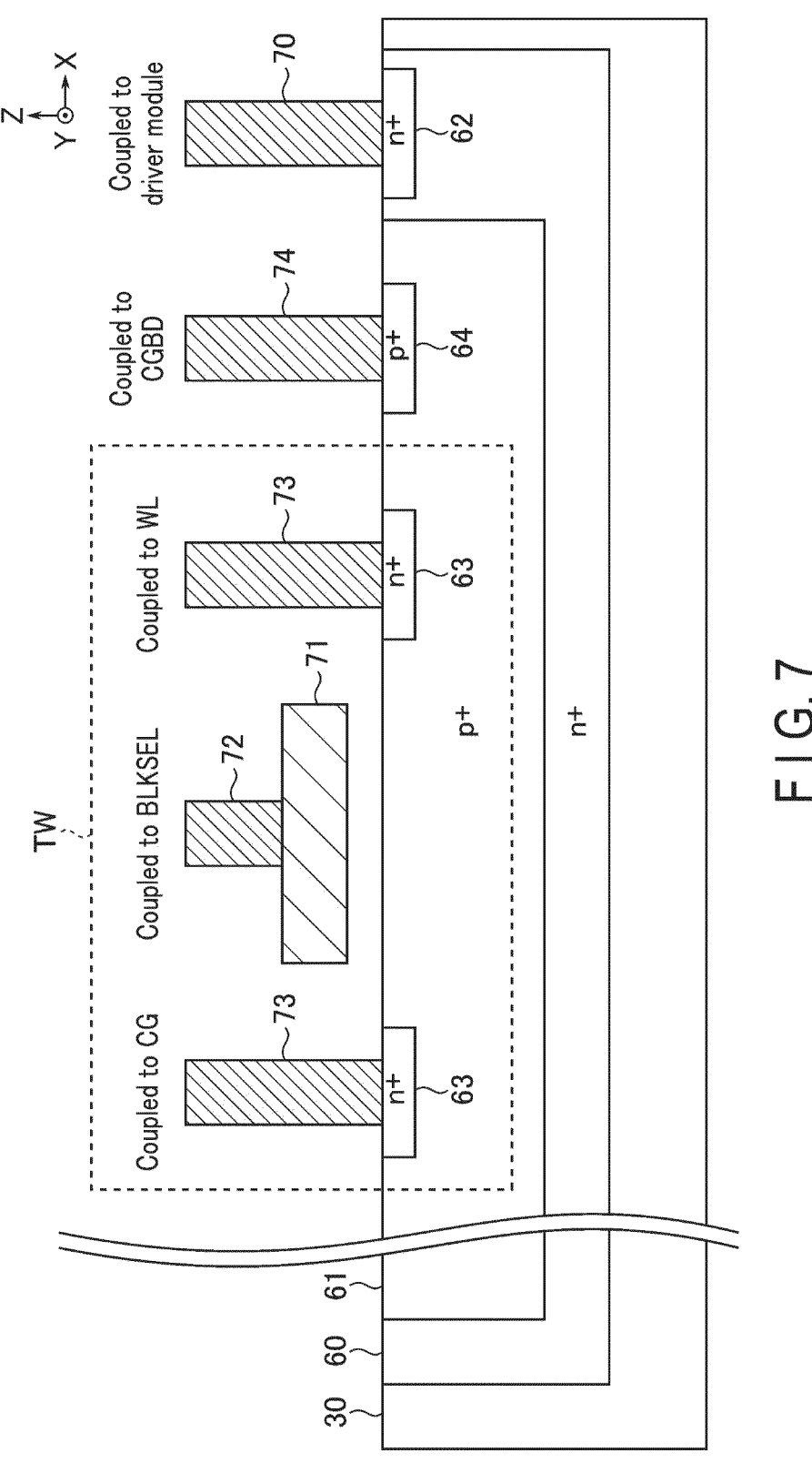
FIG. 7 is a cross-sectional view of the row decoder module taken along line VII-VII of FIG. 6.

The structure of the transistor TW of the row decoder module 17 of the semiconductor memory device 1 according to the embodiment will be described with reference to FIG. 7. FIG. 7 is a cross-sectional view of the row decoder module taken along line VII-VII of FIG. 6. In FIG. 7, a structure included in the row decoders RD1 through RDn is omitted, and a structure including the transistor TW0 of the row decoder RD0 is shown as an example.

In the cross-sectional view of the transistor TW, the semiconductor substrate 30 surrounds the bottom surface and the side surface of the N-type well region 60. The N-type well region 60 surrounds the bottom surface and the side surface of the P-type well region 61.

An N-type semiconductor region 62 is formed in an upper portion of the N-type well region 60.

A conductive layer 70 functioning as a contact is provided on the N-type semiconductor region 62. The conductive layer 70 is coupled to, for example, the driver module 16.

Two N-type semiconductor regions 63 are formed at a predetermined interval in an upper portion of the P-type well region 61. A gate electrode 71 is provided above the P-type well region 61 between the two N-type semiconductor regions 63 via a gate insulating film (not shown). With such a configuration, a MOSFET structure is formed on the P-type well region 61.

A conductive layer 72 functioning as a contact is provided on the upper surface of the gate electrode 71. The conductive layer 72 is coupled to the transfer gate line BLKSEL.

Conductive layers 73 functioning as contacts are provided on the upper surfaces of the two N-type semiconductor regions 63. One of the two conductive layers 73 is coupled to the corresponding word line WL. The other conductive layer 73 of the two conductive layers 73 is coupled to the corresponding signal line CG.

Although FIG. 7 shows a structure including the transistor TW0 included in the row decoder RD0 as an example, the transistors TW1 through TW7 included in the row decoder RD0 and the transistors TW included in the other row decoders RD also have substantially the same structure as the structure of the transistor TW0 included in the row decoder RD0.

A P-type semiconductor region 64 is formed in an upper portion of the P-type well region 61 outside the transistor TW in the X direction. A conductive layer 74 functioning as a pillar-shaped contact is provided on the upper surface of the P-type semiconductor region 64. The conductive layer 74 is coupled to the back gate line CGBG. Thus, the voltage of the back gate line CGBG is applied to the P-type well region 61 via the conductive layer 74 and the P-type semiconductor region 64. That is, the P-type well region 61 functions as a back gate of the transistor TW.

Although FIG. 7 illustrates the case where the N-type semiconductor region 62 and the P-type semiconductor region 64 are arranged along the transistor TW in the X direction, the embodiment is not limited thereto. It suffices that the N-type semiconductor region 62 is formed in an upper portion of the N-type well region 60 regardless of the positional relationship with the transistor TW. Also, it suffices that the P-type semiconductor region 64 is formed in an upper portion of the P-type well region 61 regardless of the positional relationship with the transistor TW.

1.1.6 Threshold Voltage Distribution of Memory Cell Transistors

The threshold voltage distribution of the memory cell transistors MT included in the semiconductor memory device 1 according to the embodiment will be described with reference to FIG. 8. FIG. 8 is a diagram for explaining a threshold voltage distribution of memory cell transistors included in the semiconductor memory device according to the embodiment. FIG. 8 shows an example of a threshold voltage distribution of the memory cell transistors MT in the semiconductor memory device 1 according to the embodiment. The vertical axis of the threshold voltage distribution shown in FIG. 8 indicates the number of memory cell transistors MT, and the horizontal axis indicates the threshold voltages Vth of the memory cell transistors MT.

As shown in FIG. 8, in the semiconductor memory device 1 according to the embodiment, for example, eight threshold voltage distributions are formed in accordance with the threshold voltages of the memory cell transistors MT. Hereinafter, the eight threshold voltage distributions are referred to as an "ER" state, an "A" state, a "B" state, a "C" state, a "D" state, an "E" state, an "F" state, and a "G" state, from lower to higher threshold voltages.

The "Er" state corresponds to, for example, a data erase state. The threshold voltage included in the "Er" state is lower than the voltage VA.

The "A" through "G" states correspond to states in which charges are injected into the charge storage layer with reference to the "Er" state and data is written. The threshold voltage of the memory cell transistor MT included in the "A" state is equal to or higher than the voltage VA and is lower than the voltage VB (where VB>VA). The threshold voltage of the memory cell transistor MT included in the "B" state is equal to or higher than the voltage VB and is lower than the voltage VC (where VC>VB). The threshold voltage of the memory cell transistor MT included in the "C" state is equal to or higher than the voltage VC and is lower than the voltage VD (where VD>VC). The threshold voltage included in the "D" state is equal to or higher than the voltage VD and is lower than the voltage VE (where VE>VD). The threshold voltage of the memory cell transistor MT included in the "E" state is equal to or higher than the voltage VE and is lower than the voltage VF (where VF>VE). The threshold voltage of the memory cell transistor MT included in the "F" state is equal to or higher than the voltage VF and is lower than the voltage VG (where VG>VF). The threshold voltage of the memory cell transistor MT included in the "G" state is equal to or higher than the voltage VG and is lower than the read voltage VREAD (where VREAD>VG).

The voltages VA, VB, and VC are, for example, negative voltages, the voltage VD is the ground voltage VSS, and the voltages VE, VF, and VG are positive voltages. In other words, the threshold voltages of the memory cell transistors MT included in the "Er" and "A" through "C" states have, for example, negative values. The threshold voltages of the memory cell transistor MT included in the "D" through "G" states have, for example, 0 or positive values.

In a case where any one of the voltages VA through VG is applied to the control gate, the memory cell transistor MT is turned on or off, depending on the threshold voltage of the memory cell transistor MT. More specifically, in a case where any one of the voltages VA through VG is applied to the control gate, the memory cell transistor MT is turned on if the memory cell transistor MT has a threshold voltage lower than the applied voltage, and is turned off if the memory cell transistor MT has a threshold voltage equal to or higher than the applied voltage. In a case where the read voltage VREAD is applied to the control gate, the memory cell transistor MT is turned on regardless of the threshold voltage of the memory cell transistor MT.

Different pieces of 3-bit data are allocated to the eight types of threshold voltage distributions of the memory cell transistors MT described above. An example of data allocation to the threshold voltage distribution will be listed below. In the following, data allocated to each state is indicated in the order of "upper bit, middle bit, and lower bit" in correspondence with the state.

"ER" state: "1, 1, 1" data
"A" state: "1, 1, 0" data
"B" state: "1, 0, 0" data
"C" state: "0, 0, 0" data
"D" state: "0, 1, 0" data
"E" state: "0, 1, 1" data
"F" state: "0, 0, 1" data
"G" state: "1, 0, 1" data.

If such data allocation is applied, one-page data (lower page data) constituted by the lower bits is determined by the read operation using each of the voltages VA and VE. One-page data (middle page data) constituted by the middle bits is determined by the read operation using each of the voltages VB, VD, and VF. One-page data (upper page data) constituted by the upper bits is determined by the read operation using each of the voltages VC and VG.

1.2 Read Operation

Next, a read operation using the semiconductor memory device 1 of the embodiment will be described. The read operation of the lower page data will be described below by taking, as examples, a case where the operation using the voltage VA is executed after the operation using the voltage VE (Operation Example 1) and a case where the operation using the voltage VE is executed after the operation using the voltage VA (Operation Example 2).

In the following description, the memory cell transistor MT which is a target of the read operation is referred to as a selected memory cell transistor MT. In addition, the block BLK including the selected memory cell transistor MT and the block BLK not including the selected memory cell transistor MT are referred to as a selected block BLK and a non-selected block BLK, respectively. In addition, in the selected block BLK, the word line WL and the string unit SU corresponding to the selected memory cell transistor MT are referred to as a selected word line WL and a selected string unit SU, respectively. In addition, among the word lines WL and the string units SU included in the selected block BLK, the word lines WL other than the selected word line WL and the string units SU other than the selected string unit SU are referred to as non-selected word lines WL and non-selected string units SU, respectively.

1.2.1 Operation Example 1

Operation Example 1 of the read operation according to the embodiment will be described with reference to FIG. 9. FIG. 9 is a timing chart showing voltages of respective interconnects at the time of a read operation using the semiconductor memory device according to the embodiment. Although not shown, a voltage VCC is applied to the N-type well region 60 from, for example, the driver module 16 via the conductive layer 70 and the N-type semiconductor region 62 (VCC>VSS).

At time t10, the row decoder module 17 applies a voltage of the "H" level to the transfer gate line BLKSEL (referred to as BLKSEL_SEL in FIG. 9 and the following description) of the row decoder RD associated with the selected block BLK. As a result, the transistors TS, TW, and TD of the selected block BLK are turned on. The row decoder module 17 applies a voltage of the "L" level to the transfer gate line BLKSELn of the row decoder RD associated with the selected block BLK (not shown). As a result, the transistors TUS and TUD of the selected block BLK are turned off. The row decoder module 17 applies a voltage of the "L" level to the transfer gate line BLKSEL (referred to as BLKSEL_U-SEL in FIG. 9 and the following description) of the row decoder RD associated with the non-selected block BLK. The voltage of the "L" level applied to the transfer gate line BLKSEL is a negative voltage. As a result, the transistors TS, TW, and TD of the non-selected block BLK are turned off. The row decoder module 17 applies a voltage of the "H" level to the transfer gate line BLKSELn of the row decoder RD associated with the non-selected block BLK (not illustrated). As a result, the transistors TUS and TUD of the non-selected block BLK are turned on. Therefore, the ground voltage VSS is applied to each of the select gate lines SGS and SGD0 through SGD3, and the select transistors STS and STD of the non-selected block BLK are turned off.

The row decoder module 17 transfers a voltage VSGD to select gate lines SGD (referred to as SGD_SEL in FIG. 9 and the following description) and SGS corresponding to the selected string unit SU (VSGD>VSS). The voltage VSGD is a voltage that turns on the select transistors STD and STS. The row decoder module 17 applies the ground voltage VSS to the select gate line SGD (referred to as SGD_USEL in FIG. 9 and the following description) corresponding to the non-selected string unit SU. As a result, the select transistor STD and the select transistor STS of the selected string unit SU are turned on, and the select transistor STD of the non-selected string unit SU is turned off.

The row decoder module 17 transfers the read voltage VREAD to all the word lines WL (referred to as WL_BLK-SEL in FIG. 9 and the following description) of the selected block BLK. As a result, the memory cell transistors MT in the selected block BLK are turned on.

The driver module 16 applies the voltage VBB to the back gate line CGBG. As a result, the voltage of the P-type well region 61 is boosted to the voltage VBB. The voltage VBB is lower than the voltage VCC and higher than the ground voltage VSS. With such a voltage VBB, for example, when the voltage of the word line WL_BLKSEL is equal to the ground voltage VSS, it is possible to suppress a current from flowing from the N-type well region 60 to the word line WL via the P-type well region 61. In addition, for example, when the voltage of the word line WL_BLKSEL becomes equal to the read voltage VREAD, it is possible to suppress a current from flowing from the word line WL to the N-type well region 60 via the P-type well region 61.

As described above, the voltage of the P-type well region 61 is boosted to the voltage VBB, and thus the voltage VBB of the P-type well region 61 is applied to the word line WL (referred to as WL_BLKUSEL in FIG. 9 and the following description) of the non-selected block BLK via the N-type semiconductor region 63 and the conductive layer 73 coupled to the word line WL_BLKUSEL.

The driver module 16 applies the voltage VSL to the source line SL (VSL>VSS).

At time t11, the row decoder module 17 transfers the voltage VE to a selected word line WL (referred to as WL_SEL in FIG. 9 and the following description) among the word lines WL_BLKSEL. The row decoder module 17 maintains the voltage of the non-selected word line WL (referred to as WL_USEL in FIG. 9 and the following description) at the read voltage VREAD.

The sense amplifier module 18 applies a voltage VBL to the bit line BL to precharge the bit line BL (VBL>VSS).

By the above operation, it is determined whether the threshold voltage of the selected memory cell transistor MT is higher than the voltage VE.

At time t12, the voltage VEE is applied to the back gate line CGBG. The voltage VEE is, for example, a negative voltage lower than the voltage VA (VSS>VA>VEE). The voltage VEE has the same level as, for example, the voltage of the "L" level applied to the transfer gate line BLKSEL. As a result, the voltage of the P-type well region 61 is lowered to the voltage VEE.

Further, since the voltage of the P-type well region 61 is lowered to the voltage VEE equal to or lower than the ground voltage VSS, the word line WL_BLKUSEL is brought into a floating state (Floating in FIG. 9). As a result, a leakage current starts to flow from the word line WL_BLKUSEL toward the P-type well region 61. Therefore, the voltage of the word line WL_BLKUSEL starts to lower.

At time t13, the row decoder module 17 transfers the voltage VA to the selected word line WL_SEL. The row decoder module 17 maintains the voltage of the non-selected word line WL_USEL at the read voltage VREAD. By these operations, it is determined whether the threshold voltage of the selected memory cell transistor MT is higher than the voltage VA.

At time t14, the sense amplifier module 18 applies the ground voltage VSS to the bit line BL.

The row decoder module 17 transfers the read voltage VREAD to the selected word line WL_SEL.

The driver module 16 applies the ground voltage VSS to the back gate line CGBG and the source line SL.

At time t15, the row decoder module 17 lowers the voltage of the word line WL_BLKSEL to the voltage VCU. The voltage VCU is, for example, a voltage lower than the read voltage VREAD and higher than the voltage VBB. The row decoder module 17 transfers the ground voltage VSS to the select gate lines SGD_SEL and SGS.

In the case where the voltage of the word line BLKSEL is maintained at the voltage VCU, when the block including the word line BLKSEL is selected again, the load of the operation of boosting the voltage of the word line BLKSEL to the read voltage VREAD is reduced. However, after the read operation, the voltage of the word line WL_BLKSEL is lowered with the passage of time due to a leakage current from the word line WL_BLKSEL to the P-type well region 61.

At time t16, the row decoder module 17 applies a voltage of the "L" level to the transfer gate line BLKSEL of each row decoder RD. As a result, the transistors TS, TW, and TD of each row decoder RD are turned off. The row decoder module 17 applies a voltage of the "H" level to the transfer gate line BLKSELn of each row decoder RD. As a result, the transistors TUS and TUD of each row decoder RD are turned on. Therefore, the ground voltage VSS is applied to each of the select gate lines SGS and SGD0 through SGD3 of each block BLK, and the select transistors STS and STD of each block BLK are turned off.

In the manner described above, the lower page data of the selected memory cell transistor MT is read.

1.2.2 Operation Example 2

Operation Example 2 of the read operation according to the embodiment will be described with reference to FIG. 10. FIG. 10 is a timing chart showing voltages of respective interconnects at the time of a read operation using the semiconductor memory device according to the embodiment. Hereinafter, Operation Example 2 will be described mainly in terms of differences from Operation Example 1, and the descriptions of the same operations as those in Operation Example 1 are omitted.

At time t21, the row decoder module 17 transfers the voltage VA to the selected word line WL_SEL. By this operation, it is determined whether the threshold voltage of the selected memory cell transistor MT is higher than the voltage VA.

The driver module 16 applies the voltage VEE to the back gate line CGBG. As a result, the voltage of the P-type well region 61 is lowered to the voltage VEE.

Since the voltage of the P-type well region 61 is lowered to the voltage VEE, the word line WL_BLKUSEL is brought into a floating state (Floating in FIG. 10). As a result, a leakage current starts to flow from the word line WL_BLKUSEL toward the P-type well region 61. Therefore, the voltage of the word line WL_BLKUSEL starts to lower.

At time t22, the driver module 16 applies the ground voltage VSS to the back gate line CGBG.

The row decoder module 17 transfers the voltage VE to the selected word line WL_SEL. Thus, it is determined whether the threshold voltage of the selected memory cell transistor MT is higher than the voltage VE.

By the above operation, the lower page data of the selected memory cell transistor MT is read.

1.3. Effects of Present Embodiment

With the semiconductor memory device 1 according to the embodiment, it is possible to improve an operation speed of the semiconductor memory device 1. Hereinafter, effects of the semiconductor memory device 1 according to the embodiment will be described.

According to the embodiment, the transistor TW that transfers the voltage of the signal line CG to the word line WL is provided in the P-type well region 61 on the semiconductor substrate 30. In the read operation, when the row decoder module 17 boosts the word line WL_BLKSEL to the read voltage VREAD via the transistor TW, the driver module 16 applies the positive voltage VBB to the P-type well region 61 (back gate). Thus, according to the semiconductor memory device 1 of the embodiment, when the row decoder module 17 boosts the voltage of the word line WL to the read voltage VREAD, it is possible to suppress a decrease in the current flowing through the transistor TW due to the substrate effect. That is, according to the semiconductor memory device 1 of the embodiment, it is possible to assist the voltage of the word line WL_BLKSEL to be boosted to the read voltage VREAD, and to suppress an increase in the time for boosting the voltage of the word line WL_BLKSEL. Therefore, the semiconductor memory device 1 according to the embodiment can suppress a decrease in the read speed. In addition, the semiconductor memory device 1 according to the embodiment can suppress an increase in the size of the transistor TW while maintaining the current flowing through the transistor TW.

Furthermore, the semiconductor memory device 1 according to the embodiment applies the voltage VBB to the P-type well region 61 in accordance with the boosting of the word line WL_BLKSEL to the read voltage VREAD in the read operation. As a result, the voltage of the word line WL_BLKUSEL can be boosted to the voltage VBB. Therefore, even if the selected block BLK in the next read operation is different from the selected block BLK in the previous read operation, it is possible to suppress a decrease in the read speed.

Supplementarily, in a case where the voltage of the P-type well region in the read operation is the ground voltage VSS, the voltage of the word line may be lowered to the ground voltage VSS by the time of the next selection due to, for example, a leakage current, even if the voltage VCU is applied when the word line is selected previously. In this case, the semiconductor memory device is required to boost the voltage of the word line WL_BLKSEL from the ground voltage VSS.

According to the embodiment, the voltage of the word line WL_BLKUSEL is boosted to the voltage VBB via the P-type well region 61 every time the read operation is executed. Accordingly, the voltage of the word line WL_BLKUSEL is boosted to the voltage VBB every time the read operation is performed. Thus, the semiconductor memory device 1 can start boosting the word line WL_BLKSEL from a voltage higher than the ground voltage VSS. Therefore, it is possible to suppress an increase in the time required for boosting the word line WL.

According to the embodiment, the threshold voltage of the memory cell transistor MT included in the "Er" and "A" through "C" states has, for example, a negative value. Thus, the required value of the voltage VCU can be lower than that in a case where the threshold voltages of the memory cell transistors MT included in the "Er" and "A" through "C" states have 0 or a positive value. That is, according to the embodiment, the read voltage VREAD can be set to be lower than the read voltage in a case where the threshold voltage of the memory cell transistor MT included in the "Er" and the "A" through "C" states has 0 or a positive value, and thus the voltage VCU can be set to be low. Accordingly, the difference between the voltage VBB and the voltage VCU can be reduced. Therefore, the voltage of the word line WL can be maintained at the same level as the voltage VCU by periodically selecting the word line WL without boosting the voltage of the word line to the voltage VCU.

Supplementarily, the semiconductor memory device periodically performs a read operation on each block in order to reduce the amount of voltage boosted to the read voltage VREAD. Thus, the voltage of the word line is maintained at about the voltage VCU. However, as described above, the voltage of the word line may be reduced by the leakage current.

According to the embodiment, the difference between the voltage VBB and the voltage VCU can be reduced. Thus, the voltage of the word line of the non-selected block may be boosted to about the voltage VCU for each read operation. For this reason, the amount of voltage boosted to the read voltage VREAD can be reduced without performing a periodic read operation. Therefore, it is possible to suppress a decrease in the reading speed while suppressing an increase in the current consumption of the semiconductor memory device 1.

2. Modification

The embodiment described above can be modified in various ways.

A semiconductor memory device according to a modification will be described below. Hereinafter, a configuration and an operation of a semiconductor device according to a modification will be described, mainly with respect to the matters differing from the configuration and the operation of the semiconductor memory device 1 according to the embodiment. The semiconductor memory device according to the modification also achieves the same effect as in the embodiment.

Regarding the semiconductor memory device 1 according to the embodiment, the case where the ground voltage VSS is applied to the back gate line CGBG in a period in which the read operation is not performed (hereinafter, referred to as a standby period) has been described as an example, but the embodiment is not limited thereto. The semiconductor memory device 1 may be configured such that the voltage VBB is applied to the back gate line CGBG in, for example, a standby period.

The configuration of the semiconductor memory device according to the modification can be equivalent to the configuration of the semiconductor memory device 1 according to the embodiment. Hereinafter, an operation of the semiconductor device according to the modification will be described, mainly with respect to the matters differing from the operation of the semiconductor memory device 1 according to the embodiment.

In the standby period, the driver module 16 applies the voltage VBB to the back gate line CGBG. Thus, the voltage of the word line WL becomes the voltage VBB. The driver module 16 applies the voltage VBB to the source line SL.

At time t34, the driver module 16 applies the voltage VBB to the back gate line CGBG again. As a result, the voltage of the word line WL_BLKUSEL becomes the voltage VBB.

The driver module 16 applies the voltage VBB to the source line SL again.

According to the modification, the semiconductor memory device 1 is configured to apply the voltage VBB to the back gate line CGBG even in the standby period. Thus, when the voltage of the word line WL_BLKSEL starts to be boosted to the read voltage VREAD, the time for boosting the voltage of the back gate line CGBG to the voltage VBB again can be omitted. Therefore, it is possible to suppress a decrease in the reading speed.

For example, when there is a defective block BLK in which an insulation defect occurs between the word line WL and the source line SL (contact LI) (hereinafter simply referred to as a defective block), it is possible to suppress the generation of a leakage current between the word line WL and the source line SL and to suppress an increase in current consumption.

Supplementarily, if there is a defective block, for example, when the voltage VBB is applied to the P-type well region and the ground voltage VSS is applied to the source line in a standby period, a leakage current flows from the P-type well region to the source line through the word line of the defective block. This may increase the current consumption.

According to the modification, in the standby period, a voltage equivalent to the voltage VBB applied to the P-type well region 61 is applied to the source line SL. As a result, even if there is a defective block BLK, the generation of a leakage current between the P-type well region 61 and the source line SL can be suppressed.

3. Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first memory cell;
   a word line coupled to a gate of the first memory cell;
   a first transistor having a first end coupled to the word line;
   a control circuit configured to, in a read operation, apply a first voltage, which is positive, to a back gate of the first transistor; and
   a substrate including a first region of a first conductivity type and a second region of a second conductivity type provided inside the first region, the substrate being of the second conductivity type,
   wherein:
   the first transistor is provided in the second region, and
   the control circuit is configured to, in the read operation, apply a second voltage which is higher than the first voltage to the first region.

2. The device of claim 1, wherein the control circuit is configured to, in the read operation, apply the first voltage to the back gate of the first transistor while the first transistor is in an ON state.

3. The device of claim 1, wherein the control circuit is configured to, in the read operation, apply the first voltage to the back gate of the first transistor while the first transistor is in an OFF state.

4. The device of claim 1, further comprising:
   a second transistor coupled in series to the first memory cell; and
   a third transistor coupled to a gate of the second transistor and provided in a third region on the substrate and outside the first region and the second region.

5. The device of claim 1, wherein the control circuit is configured to, in the read operation, apply the first voltage to the second region.

6. The device of claim 1, wherein the control circuit is configured to, in a period in which the read operation is not performed, apply the first voltage to the back gate of the first transistor.

7. A semiconductor memory device comprising:

a first memory cell;

a word line coupled to a gate of the first memory cell;

a first transistor having a first end coupled to the word line;

a control circuit configured to, in a read operation, apply a first voltage, which is positive, to a back gate of the first transistor; and a source line coupled to the first memory cell, wherein:

the control circuit is configured to, in a period in which the read operation is not performed, apply the first voltage to the back gate of the first transistor, and the control circuit is configured to, in the period in which the read operation is not performed, apply the first voltage to the source line while applying the first voltage to the back gate of the first transistor.

8. A semiconductor memory device comprising:

a first memory cell;

a word line coupled to a gate of the first memory cell;

a first transistor having a first end coupled to the word line;

a control circuit configured to, in a read operation, apply a first voltage, which is positive, to a back gate of the first transistor; and a source line coupled to the first memory cell, wherein the control circuit is configured to, in a period in which the read operation is not performed, apply a voltage lower than the first voltage to the back gate of the first transistor and the source line.

9. The device of claim 2, wherein the control circuit is configured to, in the read operation, apply the first voltage to the back gate of the first transistor when a third voltage higher than the first voltage is transferred to the gate of the first memory cell via the first transistor.

* * * * *